United States Patent

Shaw

[15] 3,635,771

[45] Jan. 18, 1972

[54] METHOD OF DEPOSITING SEMICONDUCTOR MATERIAL

[72] Inventor: Don W. Shaw, Garland, Tex.

[73] Assignee: Texas Instruments Incorporated, Dallas, Tex.

[22] Filed: May 21, 1968

[21] Appl. No.: 730,804

[52] U.S. Cl. ....................148/175, 117/106 A, 117/107.2 R, 148/1.5, 148/174, 252/62.3 GA

[51] Int. Cl. ....................H01l 7/36, C23c 11/00, H01l 3/00

[58] Field of Search ..........................148/1.5, 1.6, 174, 175; 156/17; 117/106, 107.2; 23/273, 204; 252/62.3

[56] References Cited

UNITED STATES PATENTS

| | | | |
|---|---|---|---|
| 3,224,911 | 12/1965 | Williams et al. | 148/175 |
| 3,297,501 | 1/1967 | Reisman | 148/1.6 X |
| 3,314,832 | 4/1967 | Raithel | 148/174 X |
| 3,361,600 | 1/1968 | Reisman et al. | 148/174 X |

OTHER PUBLICATIONS

Goldsmith, N., & Oshinsky W. " Vapor-Phase Synthesis and Epitaxial Growth of Gallium Arsenide" R.C.A. Review, Dec. 1963, V. 24, 546– 554

Effer, D. " Epitaxial Growth of Doped and Pure GaAs in an Open Flow System" J. Electrochem. Soc. Vol. 112, No. 10 p. 1020– 1025 (1965)

Eddolls et al. " Preparation and Properties of Epitaxial Gallium Arsenide" 1966 Symposium on Gallium Arsenide, paper No. 1, pp. 3– 9

*Primary Examiner*—L. Dewayne Rutledge
*Assistant Examiner*—W. G. Saba
*Attorney*—Samuel M. Mims, Jr., James O. Dixon, Andrew M. Hassell, Harold Levine, James C. Fails, Melvin Sharp and Richards, Harris and Hubbard

[57] ABSTRACT

An improved method of depositing a semiconductor material from a gaseous reactant stream containing unwanted contaminants onto a substrate by contacting the gaseous reactant stream from which the semiconductor material is to be deposited with a solid form of the same semiconductor material before the gaseous reactant stream is passed over the substrate. The solid semiconductor material, for example, gallium arsenide, may take the form of a layer of gallium gallium coated on the wall of a reactor within which the deposition of gallium arsenide is to be made, the coating being formed at a point between the source of the gaseous reactant stream and the substrate so that the gaseous reactant stream will pass over the coating before encountering the substrate. Impurities in the gaseous reactant stream will be absorbed by the coating of gallium arsenide thus reducing the level of impurities in the gaseous reactant stream before it reaches the substrate.

10 Claims, 1 Drawing Figure

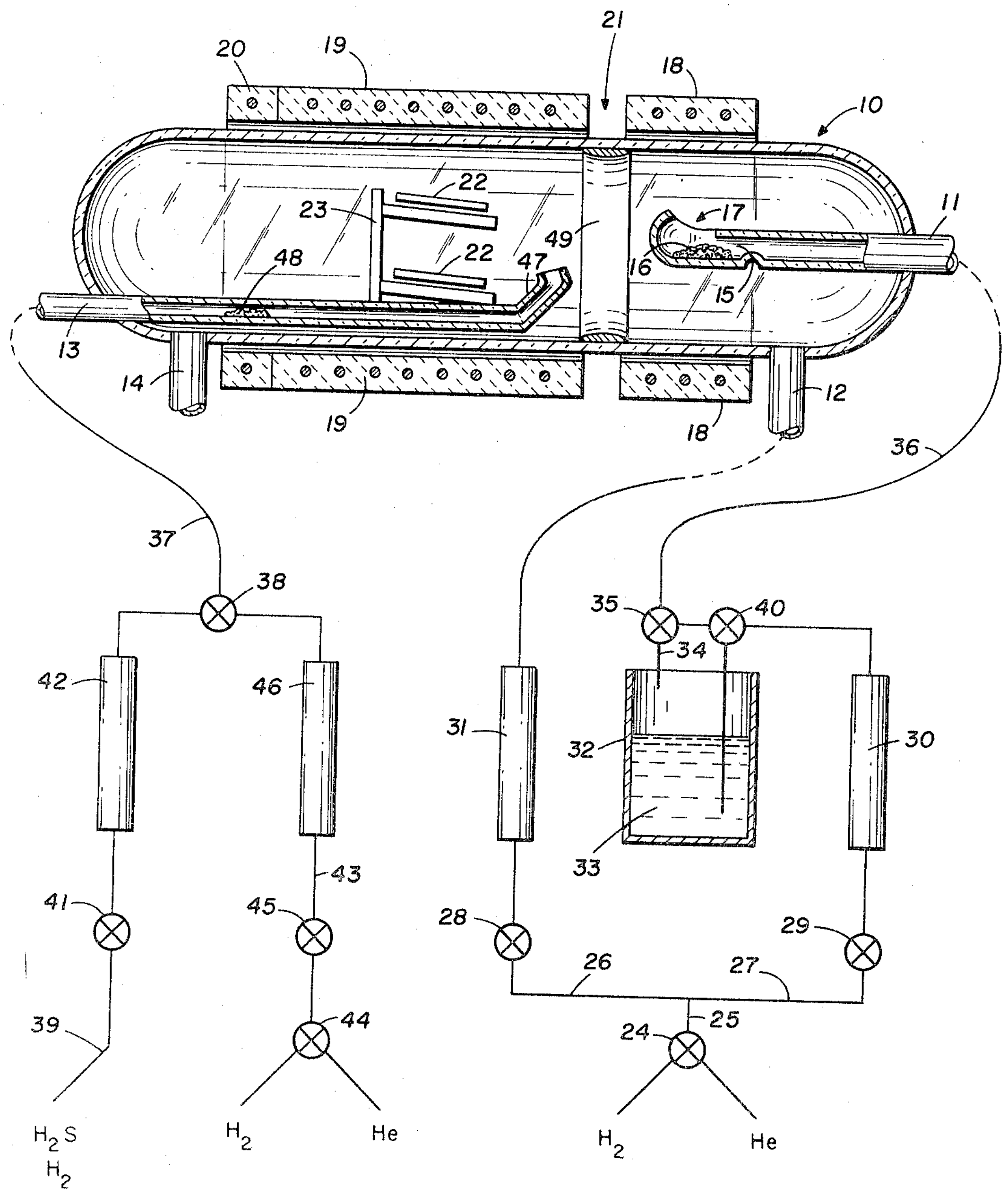
INVENTOR
DON W. SHAW
V. Bryan Medlock, Jr.
ATTORNEY

METHOD OF DEPOSITING SEMICONDUCTOR MATERIAL

This invention relates to chemistry, and more particularly to the deposition of a semiconductor material from a gaseous stream onto a substrate.

Those skilled in the semiconductor art realize that some semiconductor materials could be extremely useful for fabrication of a semiconducting device if they could be obtained in high enough purities. For example, gallium arsenide transistors would operate at higher temperatures than silicon transistors. Gallium arsenide transistors would also operate at higher frequencies than those fabricated from silicon, since the theoretical electron mobility, at room temperature, of gallium arsenide is 11,000 cm.$^2$/volt-sec., while that of silicon is 1,500 cm.$^2$/volt-sec. Also since gallium arsenide exhibits the "-Gunn" effect, which silicon does not demonstrate, gallium arsenide could be used as a solid-state microwave oscillator.

While the inherent advantages of gallium arsenide have been recognized, the material has not been widely employed since it has been next to impossible to obtain the material free from relatively large quantities of impurities such as silicon, copper, iron and transition metals which drastically lower the mobility and interfere with the high-temperature characteristics of the material. Due to the presence of these impurities, the gallium arsenide thus far produced typically exhibits an electron mobility between about 4,000 and 5,000 cm.$^2$/volt-sec.

Since gallium arsenide is unstable at its melting point and will decompose rather than melt, it cannot be practically zone refined to remove impurities.

Attempts to compound gallium arsenide in order to lower the impurity level have generally been unsuccessful. For example, attempts have been made to admix very pure gallium and arsenic and pull a crystal from the unstable melt, which requires very careful control of the arsenic content as the arsenic will tend to vaporize at the melting temperature of the compound. However, such attempts have generally been unsuccessful since the crystal is usually pulled in a quartz container at temperatures of about 1,238° C. and the silicon obtained from the quartz vessel is a dopant for gallium arsenide. In order to avoid the problems encountered in the pulling of a crystal from a melt of gallium and arsenic, attempts have been made at growing arsenide, from a vapor at a temperature of 750° C., to reduce the silicon contamination from the quartz vessel in which the vapor deposition is conducted. However, the gases employed pass through metal fittings and piping before being admitted to the reaction chamber within which they are deposited, thus introducing impurities such as copper and iron to the gas. These impurities are absorbed by the growing gallium arsenide, greatly lowering its mobility. Even if metal fittings and containers are not utilized for handling of the gaseous stream, the compounds from which the gaseous stream is prepared cannot be obtained in sufficient purity to eliminate the undesirable metal contaminants to a sufficient extent.

Thus, while those skilled in semiconductor industry have fully appreciated the inherent potential of various semiconductor materials, they have been frustrated in attempts to employ these materials, due to their inability to produce the materials in sufficient purity.

The present invention may be generally described as an improvement in the method of depositing a semiconductor material from a gaseous stream onto a substrate which includes the step of contacting the gaseous stream onto a substrate which includes the step of contacting the gaseous stream from which the semiconductor material is to be deposited with a solid form of the same semiconductive material before passing the gaseous stream over the substrate for removing unwanted contaminants from the gaseous stream.

Various of the advantages and objects of the present invention will be understood by reference to the following description and appended claims in conjunction with the drawing which illustrates a schematic cross section of an apparatus suitable for performing the method of the present invention.

With reference to the drawing, the apparatus comprises an elongated quartz reaction vessel 10 having three inlets 11, 12 and 13 and exhaust 14. A constriction 15 is provided within the tube portion of inlet 11 which contains a small amount of source material 16, which may comprise high purity gallium, gallium arsenide or a mixture of the two. The construction 15 is so constructed as to cause gas entering through inlet 11 to contact the material 16 as it flows out of the constriction through opening 17, and into the reaction vessel-cavity. The reaction vessel 10 is positioned within two furnaces 18 and 19 which define a gap 21 therebetween. The furnaces 18 and 19 serve to maintain two separately controlled temperature zones. Furnace 18 will maintain a first temperature zone over the source material 16, while furnace 19 will maintain a second temperature zone over the two substrates 22 supported within vessel 10 by a quartz support 23.

Means are provided for admitting gas to reaction vessel 10 and take the form of a valve 24 which may be alternately positioned to admit either hydrogen or helium to line 25. Line 25, through a tee, discharges into lines 26 and 27 which are provided with valves 28 and 29, respectively. Gas admitted to line 26 can flow through valve 28 and flow meter 31 for discharge into inlet 12. Gas admitted to line 27 will, upon the opening of valve 29, flow through flow meter 30 and valve 40 into a bubbler 32 containing a halide of arsenic, such as arsenic trichloride. Line 27 terminates below the liquid level in bubbler 32 so that any gas passing through line 27 will be admitted below the surface of the liquid 33. Gas so admitted raises to the surface of the liquid in small bubbles and thus becomes saturated with the vapor of the liquid arsenic trichloride. The saturated gas leaves bubbler 32 by way of an exit tube 34 which feeds into inlet 11 of vessel 10 through valve 35 and line 36.

Gas may be admitted to inlet 13 through line 37 and three-way valve 38. With valve 38 turned to one position, line 37 communicates with a source of hydrogen and hydrogen sulfide which is admitted to valve 38 through line 39, valve 41 and flowmeter 42. Manipulation of valve 38 to a second position connects line 37 and thus inlet 13 with a source of hydrogen or helium which is directed to valve 38 through valves 44 and 45 line 43 and flowmeter 46.

Inlet 13, which comprises a tube running parallel with a longitudinal axis of vessel 10, discharges through an upturned tip portion 47 within the temperature zone maintained by furnace 19. Inlet 13 may have a dopant material 48 disposed therein so that gases passing into inlet 13 will pass over the dopant before being discharged through upturned end 47. To provide a desired vapor pressure over a solid dopant material 48, the apparatus is provided with a dopant heater 20, the temperature of which is adjustable so that different dopant materials may be used. Gas within vessel 10 can exit through discharge 14 to a suitable exhaust system.

The apparatus described above may be used to perform the method of the present invention in the following manner. The apparatus is assembled, as illustrated in the drawing, but the support 23 and substrates 22 are omitted from the vessel 10. A dry helium gas is admitted to inlets 11 and 12 by opening valves 24, 28 and 29 and positioning three-way valves 40 and 35 to bypass bubbler 32 and admit the helium to inlet 11. Thus helium is admitted to both inlets 11 and 12. Simultaneously, helium is admitted to inlet 13 by opening valves 44 and 45 and positioning valve 38 to admit helium in line 43 to line 37 and thus inlet 13. The dry helium serves to flush the vessel 10 of any air and water vapor, and when the vessel 10 has been sufficiently flushed, furnaces 18 and 19 are activated. Furnace 18 is controlled to produce a temperature of approximately 825° C. in a zone where the gallium and/or gallium arsenide material 16 is positioned. Furnace 19 is regulated to produce a temperature of 750° C. in that zone of vessel 10 surrounded by the furnace. Hydrogen, which serves as a carrier gas, is then admitted to bubbler 32 by positioning valve 24 to communicate a source of hydrogen with line 25 and opening valves 29 and 40. Valve 28 is also opened to admit hydrogen to inlet 12, and valve 35 is positioned to admit the gaseous stream of hydrogen and arsenic trichloride vapor from bubbler 32 into line 36 and inlet 11. The hydrogen and arsenic trichloride vapor admitted through inlet 11 passes over the gallium and/or gallium arsenide material 16 within the constriction 15. When the material 16 is gallium, the reaction of the gas with the gallium is believed to be:

$$4\ AsCl_{3(g)} + 12\ Ga_{(l)} \xrightarrow[H_2]{825°\ C} 12\ GaCl_{(g)} + As_{4(g)}$$

Or in the case of the material 16 being gallium arsenide:

$$AsCl_{3(g)} + 3\ GaAs_{(s)} \xrightarrow[H_2]{825°\ C} 3\ GaCl_{(g)} + As_{4(g)}$$

The gases thus leaving opening 17 and constriction 15 are swept into the reaction vessel cavity over the portion of the vessel wall underlying gap 21. As the gases pass from the high temperature zone of furnace 18 and encounter the relatively cool wall of the portion of vessel 10 underlying gap 21, the following disproportionation reaction occurs:

$$3\ GaCl_{(g)} \xrightarrow[H_2]{725°\ C} 2\ Ga_{(g)} + GaCl_{3(g)}$$

Formation of gallium arsenide then results from the equation:

$$4\ Ga_{(g)} + As_{4(g)} \xrightarrow[H_2]{725°\ C} 4\ GaAs_{(s)}$$

Thus, the gases leaving opening 17 and constriction 15 will deposit a coating 49 of gallium arsenide on the wall of reactor vessel 10. The unreacted gases and byproducts of the above reactions then exit vessel 10 to discharge line 14, along with any helium being circulated through inlet line 13. The coating 49 may be formed on the wall of reactor 10 at temperatures between about 500° C. and 730° C. though about 725° C. is preferred. Hydrogen is admitted through inlet 12 in order to prevent the gases leaving opening 17 from backing up into the neck of vessel 10 and depositing gallium arsenide coating on the cooler portion of the vessel to the right of furnace 18, as viewed in the drawing. When coating 49 is formed around the inside of vessel 10, the gas flow through vessel is terminated and the furnaces 18 and 19 deactivated to permit insertion of support 23 and substrates 22 which will be supported thereby. After the substrates 22 and support 23 are inserted in vessel 10, the helium-flushing procedure is repeated. Upon completion of the helium flush, furnaces 18 and 19 are reactivated bringing the temperature of the zone surrounded by furnace 18 to 825° C. and that of the zone surrounded by furnace 19 to 750° C. Hydrogen is then admitted to bubbler 32 and valve 35 positioned to admit the hydrogen containing the arsenic trichloride vapor to inlet 11. Valve 28 is also opened to admit hydrogen to inlet 12. The gas-leaving opening 17 in construction 15 will again pass over coating 49, where a portion of the gases will react as described above to deposit gallium arsenide, but the major portion of the gases will flow over substrates 22 to deposit gallium arsenide upon the substrates before being discharged from vessel 10 through discharge 14. The gaseous stream leaving opening 17 upon encountering coating 49 will lose many of the unwanted contaminants as the gallium arsenide coating 49 will exhibit preferential absorption. Preferential absorption is used in the present context to mean that those impurities which would have been absorbed or would have reacted with the gallium arsenide deposited upon the substrates 22 will react with the gallium arsenide coating 49, depleting the gaseous stream of many of the impurities which would have been absorbed by the substrates 22. Coating 49 will, since it is of the same material as the coating to be applied to substrates 22, absorb those impurities which, but for coating 49, would be absorbed by the coating on substrates 22.

If the gallium arsenide being coated on substrates 22 is to be doped with an N-type dopant, hydrogen sulfide and hydrogen may be admitted to inlet line 13 by opening valve 41 and positioning valves 38 so that the hydrogen and hydrogen sulfide may pass through inlet 13 and through upturned tip 47 where the gaseous stream from constriction opening 17 will be directed across substrates 22. If selenium and tellurium are to be used as the N-type dopants, quantities of the material may be deposited in the manner illustrated by reference numeral 48 and hydrogen passed through valves 44, 45 and 38 to entrain vaporized selenium or tellurium for discharge in the vessel 10. If, for example, a P-type dopant is to be used, cadmium may be disposed in inlet line 13 where it may be entrained in hydrogen vapor, in the same manner as described above in connection with the doping with selenium and tellurium, for discharge through tip 47 onto substrate 22.

By use of the present invention, semiconductors may be fabricated having electron mobilities greater than 8,000 $cm.^2$/volt-sec. as compared with semiconductors prepared without the provision of a ring 49 of gallium arsenide on the wall of vessel 10 which would typically have electron mobilities of 4,000–5000 $cm.^2$/volt-sec.

The increased electron mobility is realized because impurities which would lower the mobility of the gallium arsenide coated upon substrates 22 are absorbed by coating 49. While the gaseous stream passed over coating 49 will be depleted of some of the reactants, it will be depleted of trace quantities of impurities to a greater extent.

While coating 49 is illustrated in the drawing as a ring shaped layer of gallium arsenide on the wall of vessel 10, solid gallium arsenide in other forms and shapes could be interposed between the opening 17 in the construction 15 and the substrates 22.

For example, a bed of particulate gallium arsenide retained between quartz wool plugs, through which the gaseous stream could be passed, could be used.

Other means of interposing a gallium arsenide surface between the source of reactant gases and the substrate will undoubtedly occur to those skilled in the art.

While the above description mentions an embodiment of the invention involving gallium arsenide, the invention may also be used in purifying reaction gases from which are to be deposited other III–V semiconducting materials, such as indium arsenide, gallium phosphide and alloys of such as gallium indium arsenide $Ga_xIn_{1-x}As$) and gallium arsenide phosphide ($Ga\ As_x\ P_{1-x}$).

While rather specific terms have been used in describing various embodiments of the present invention, they are not intended, nor should they be construed as limitation upon the invention as defined by the following claims.

What is claimed is:

1. A method for decontaminating a reactant gas of the type used in a reaction vessel for vapor depositing gallium arsenide onto a gallium arsenide substrate, comprising the following steps:
   - a. selectively positioning a solid mass of gallium arsenide material between the inlet of said vessel and said gallium arsenide substrate, said solid mass of gallium arsenide being in the form in which it will remain in its solid state at a preselected deposition temperature;
   - b. injecting a carrier gas into said vessel at said inlet, said carrier gas consisting essentially of hydrogen;
   - c. positioning a preselected quantity of said gallium arsenide in the path of said carrier gas to produce said reactant gas, said reactant gas consisting essentially of gallium halogen gas and arsenic gas;
   - d. forming three temperatures zones within said vessel,
     1. the first temperature zone being approximately 825° C. and including said inlet and said preselected quantity of gallium arsenide,
     2. the second temperature zone being within the temperature range of 500°–730° C. and including said solid mass of gallium arsenide, and
     3. the third temperature zone being approximately 750° C. and including said gallium arsenide substrate; wherein e. said carrier gas first passes over said preselected quantity of gallium arsenide to produce said reactant gas, then said reactant gas passes over said solid mass of gallium arsenide for decontaminating said reactant gas, and then said decontaminated reactant gas passes over said gallium arsenide substrate for vapor depositing said gallium arsenide onto said gallium arsenide substrate.

2. A method for decontaminating a reactant gas of the type used in a reactant vessel for vapor depositing a selected III–V material onto a support substrate that is capable of supporting vapor deposition thereon of said selected III–V material, comprising the following steps:

a. forming three temperatures zones within said vessel,
  1. the first temperature zone including the inlet region of said vessel and being at a value sufficient to maintain a mixture of a preselected gaseous Group III species and a gaseous Group V species in their gaseous states.
  2. the second temperature zone including the outlet region of said vessel and being at a value sufficient for vapor deposition of said III–V material upon a support substrate, and
  3. the third temperature zone being intermediate said inlet and outlet regions of said vessel and being at a value sufficient to maintain a solid mass of said III–V material in its solid state, b. selectively positioning a preselected quantity of said III–V material within said inlet region;

c. forming a solid mass of said III–V material within said intermediate region;

d. positioning said support substrate within said outlet region; and e. injecting a carrier gas into said inlet region and passing said carrier gas over said preselected quantity of said III–V material to produce said reactant gas; wherein f. said carrier gas enters said inlet region and passes over said preselected quantity of said III–V material to produce said reactant gas which is a gaseous mixture of a gaseous Group III species and a gaseous Group V species, then said reactant gas enters said intermediate zone and passes over said solid mass of said III–V material for substantially decontaminating said reactant gas, and then said substantially decontaminated reactant gas enters said outlet region and passes over said support substrate for vapor deposition of said III–V material onto said support substrate.

3. The method of claim 2 wherein said first temperature zone is about 825° C., said second temperature zone is about 750° C., and said third temperature zone is within the temperature range of 500°–730° C.

4. The method of claim 2 wherein said III–V material is selected from the group consisting of gallium arsenide, indium arsenide, gallium phosphide, gallium indium arsenide and gallium arsenide phosphide.

5. The method of claim 2 wherein said solid mass of said III–V material is secured to the inner wall of said vessel within said intermediate region.

6. The method of claim 2 wherein said carrier gas includes a transport agent capable of transporting the Group III species of said preselected quantity of III–V material in a gaseous state.

7. The method of claim 2 and further including the step of mixing hydrogen gas and arsenic gas to produce said carrier gas.

8. The method of claim 2 wherein said reactant gas is a gaseous mixture including hydrogen gas, a halogen gas and an arsenic gas.

9. The method of claim 2 and further including the step of injecting preselected dopants in gaseous form within said outlet region of said vessel between said support substrate and said solid mass of III–V material at substantially the same time that said carrier gas is injected into said inlet region.

10. A method for preferentially absorbing unwanted contaminants from a reactant gas of the type used in a reactant vessel prior to vapor depositing a III–V material onto a support substrate that is capable of supporting vapor deposition thereon of said selected III–V material, comprising the following steps:

a. forming three temperature zones within said vessel,
  1. the first temperature zone including the inlet region of said vessel and being at a value sufficient to maintain a gaseous Group III species and a gaseous Group V species in its gaseous state,
  2. the second temperature zone including the outlet region of said vessel and being at a value sufficient for vapor deposition of said III–V material upon a support substrate, and
  3. the third temperature zone being intermediate said inlet and outlet regions of said vessel and being at a value sufficient to maintain a solid mass of said III–V material in its solid state, b. selectively positioning a preselected quantity of said III–V material within said inlet region;

c. injecting a carrier gas into said inlet region and passing said carrier gas over said preselected quantity of said III–V material to produce said reactant gas; wherein d. said carrier gas enters said inlet region and passes over said preselected quantity of said III–V material to produce said reactant gas which is a gaseous mixture of a gaseous Group III species and a gaseous Group V species, then said reactant gas enters said intermediate zone to produce a solid mass of said III–V material therein, and then the remaining reactant gas enters said outlet region and is exhausted therefrom;

deactivating said temperature zones within said vessel to a selected temperature;

f. positioning said support substrate within said outlet region;

g. repeating step (a) above so as to reactivate said temperature zones within said vessel; and h. injecting a carrier gas into said inlet region and passing said carrier gas over said preselected quantity of said III–V material to produce said reactant gas; wherein i. said carrier gas enters said inlet region and passes over said preselected quantity of said III–V material to produce said reactant gas which is a gaseous mixture of a gaseous Group III species and gaseous Group V species, then said reactant gas enters said intermediate zone and passes over said solid mass of said III–V material for preferentially absorbing unwanted contaminants from said reactant gas, and then said substantially decontaminated reactant gas enters said outlet region and passes over said support substrate for vapor deposition of said III–V material onto said support substrate.

* * * * *